(12) United States Patent
Liang

(10) Patent No.: US 11,178,775 B2
(45) Date of Patent: Nov. 16, 2021

(54) MANUFACTURING METHOD OF CIRCUIT BOARD AND DISPLAY DEVICE

(71) Applicants: HKC CORPORATION LIMITED, Shenzhen (CN); CHONGQING HKC OPTOELECTRONICS TECHNOLOGY CO., LTD., Chongqing (CN)

(72) Inventor: Shuozhen Liang, Chongqing (CN)

(73) Assignees: HKC CORPORATION LIMITED, Shenzhen (CN); CHONGQING HKC OPTOELECTRONICS TECHNOLOGY CO., LTD., Chongqing (CN)

( * ) Notice: Subject to any disclaimer, the term of this patent is extended or adjusted under 35 U.S.C. 154(b) by 0 days.

(21) Appl. No.: 16/311,669

(22) PCT Filed: Dec. 8, 2017

(86) PCT No.: PCT/CN2017/115212
§ 371 (c)(1),
(2) Date: Dec. 19, 2018

(87) PCT Pub. No.: WO2019/071778
PCT Pub. Date: Apr. 18, 2019

(65) Prior Publication Data
US 2021/0235589 A1    Jul. 29, 2021

(30) Foreign Application Priority Data

Oct. 10, 2017   (CN) .......................... 201710937030.9

(51) Int. Cl.
*H05K 3/22* (2006.01)
*H05K 1/02* (2006.01)

(52) U.S. Cl.
CPC ............... *H05K 3/22* (2013.01); *H05K 1/028* (2013.01); *H05K 2201/10136* (2013.01)

(58) Field of Classification Search
CPC ................... H05K 3/22; H05K 1/028; H05K 2201/10136; Y10T 29/4913; Y10T 29/49155
(Continued)

(56) References Cited

U.S. PATENT DOCUMENTS 6,621,234 B2 * 9/2003 Itoh .......................... H01J 11/12
                                                              313/306
7,419,380 B2 * 9/2008 Yamada ............... H05K 1/0269
                                                              349/149
(Continued)

FOREIGN PATENT DOCUMENTS

| CN | 2754311 Y | 1/2006 |
|---|---|---|
| CN | 102686026 A | 9/2012 |
| CN | 105654856 A | 6/2016 |

*Primary Examiner* — Donghai D Nguyen
(74) *Attorney, Agent, or Firm* — Kilpatrick Townsend & Stockton

(57) ABSTRACT

A manufacturing method of a circuit board and a display device are provided. In the method, an error caused by that pin alignment on a conventional flexible substrate after a pin column is disposed on the flexible substrate based on a second pin position and a hot pressing process is performed is adjusted, so that the pin alignment is more accurate after the flexible substrate on which a pin is disposed based on a position of the to-be-disposed pin column is finally hot pressed with the display panel, thereby avoiding a problem that the pin is misplaced or short-circuited, and improving a good rate of the product.

11 Claims, 4 Drawing Sheets

(58) Field of Classification Search
USPC .................................................. 29/832, 846
See application file for complete search history.

(56) References Cited

U.S. PATENT DOCUMENTS 7,471,368 B2 * 12/2008 Yamazaki ........... G02F 1/13452
  349/152
2002/0047586 A1   4/2002 Itoh et al.

* cited by examiner

MANUFACTURING METHOD OF CIRCUIT BOARD AND DISPLAY DEVICE

CROSS-REFERENCE TO RELATED APPLICATIONS

This application is a U.S. national Stage of International Application No. PCT/CN2017/115212, filed on Dec. 8, 2017, designating the United States, which claims priority to Chinese Patent Application No. 20170937030.9, filed with the Chinese Patent Office on Oct. 10, 2017 and entitled "MANUFACTURING METHOD OF CIRCUIT BOARD AND DISPLAY DEVICE", the content of each of which is hereby incorporated by reference in its entirety.

TECHNICAL FIELD

This application relates to the field of liquid crystal display, and more particularly relates to a manufacturing method of a circuit board, and further relates to a display device.

BACKGROUND

A liquid crystal display panel needs to perform pin alignment bonding with a flexible circuit board, so that the flexible circuit board can drive the liquid crystal display panel. Ideally, pins on the flexible circuit board can be in an accurate one-to-one correspondence to pins on the liquid crystal display panel after the bonding. However, because the flexible circuit board shrinks when being heated for bonding with the liquid crystal display panel, the pins on the flexible circuit board and the pins on the liquid crystal display panel after the bonding may be misplaced or short-circuited, causing abnormal displaying, and further increasing a defect rate of the product.

SUMMARY

Accordingly, it is necessary to provide a manufacturing method of a circuit board and a display device, to improve pin alignment accuracy.

A manufacturing method of a circuit board includes:
providing a first substrate;
obtaining a first pin position of a pin column of the first substrate in a target state, where the pin column is configured to connect to a signal line on a first component in a one-to-one correspondence;
performing linear shrinkage on the first pin position based on a heat expansion situation of the first substrate when the first substrate is bonded with the first component, and remaining a central position of the pin column unchanged and shrinking a spacing of adjacent pins by a certain value, to obtain a second pin position of the pin column;
disposing the pin column on a second substrate based on the second pin position, bonding the second substrate with the first component, and recording positions of pins of the pin column after the bonding, to obtain a third pin position;
performing a subtraction operation on distance values of pins in the first pin position and the third pin position relative to the central position, and performing an addition operation on a result value and distance values of pins in the second pin position relative to the central position, to obtain a first position; and
disposing the pin column on the first substrate based on the first position.

A manufacturing method of a circuit board includes:
providing a first substrate;
obtaining a first pin position of a pin column of the first substrate in a target state, where the pin column is configured to connect to a signal line on a first component in a one-to-one correspondence;
obtaining an expansion quantity of pins at two edges separately relative to a central position after the pin column disposed based on the first pin position is bonded, and performing linear proportional shrinkage on the first pin position based on the expansion quantity, where a shrinkage quantity of each pin is a multiplication value of the expansion quantity and a ratio of a distance between the pin and the central position to a distance between a pin at an edge and the central position, to obtain a second pin position of the pin column.

disposing the pin column on a second substrate based on the second pin position, bonding the second substrate with the first component, and recording positions of pins of the pin column after the bonding, to obtain a third pin position, where pins in the first pin position are symmetrically disposed about the central position, pins in the second pin position are symmetrically disposed about the central position, and pins in the third pin position are symmetrically disposed about the central position.

performing a subtraction operation on distance values of pins in the first pin position and the third pin position relative to the central position, and performing an addition operation on a result value and distance values of pins in the second pin position relative to the central position, to obtain a first position; and disposing the pin column on the first substrate based on the first position.

A display device includes:
a circuit board, being a circuit board manufactured based on the foregoing manufacturing method; and
a display panel, where the display panel includes a signal line, and the signal line is connected to a pin of the circuit board.

In the foregoing manufacturing method of a circuit board, linear preshrinking is performed on the first pin position in the target state based on a heat expansion situation of the substrate in a bonding process, to obtain the second pin position; and a pin position (the third pin position) of the substrate after being performed with the bonding process when the pin column is disposed based on the second pin position is obtained. Finally, a subtraction operation is performed on distance values of pins in the first pin position and the third pin position relative to a central position of the substrate, and an addition operation is performed on a result value and distance values of pins in the second pin position relative to the central position of the substrate, to obtain a position of the to-be-disposed pin column. Therefore, in the method, an error caused by that pin alignment on a conventional flexible substrate after a pin column is disposed on the flexible substrate based on a second pin position and a hot pressing process is performed is further adjusted, so that the pin alignment is more accurate after the flexible substrate on which a pin is disposed based on a position of the to-be-disposed pin column is finally hot pressed with the display panel, thereby avoiding a problem that the pin is misplaced or short-circuited, and improving a good rate of the product.

BRIEF DESCRIPTION OF THE DRAWINGS

To illustrate the technical solutions according to the embodiments of the present invention or in the prior art more clearly, the accompanying drawings for describing the embodiments or the prior art are introduced briefly in the following. Apparently, the accompanying drawings in the following description are only some embodiments of the present invention, and persons of ordinary skill in the art can derive other drawings from the accompanying drawings without creative efforts.

DETAILED DESCRIPTION OF THE EMBODIMENTS

For ease of understanding, the following provides a more comprehensive description to this application with reference to the related accompanying drawings. Embodiments of this application are given in the accompanying drawings. However, this application can be implemented in many different forms, and is not limited to the embodiments described in this specification. Rather, the objective of providing these embodiments is to make the understanding of disclosed content of this application more thorough and comprehensive.

Unless defined otherwise, meanings of all technical and scientific terms used in this specifically are the same as those generally understood by a person skilled in the technical field of the prevent invention. The terms used in this specification of the present disclosure are merely for the purpose of describing specific embodiments, and are not intended to limit this application. The term "and/or" used in this specification includes any and all combinations of one or more relative listed items.

Figure 1:
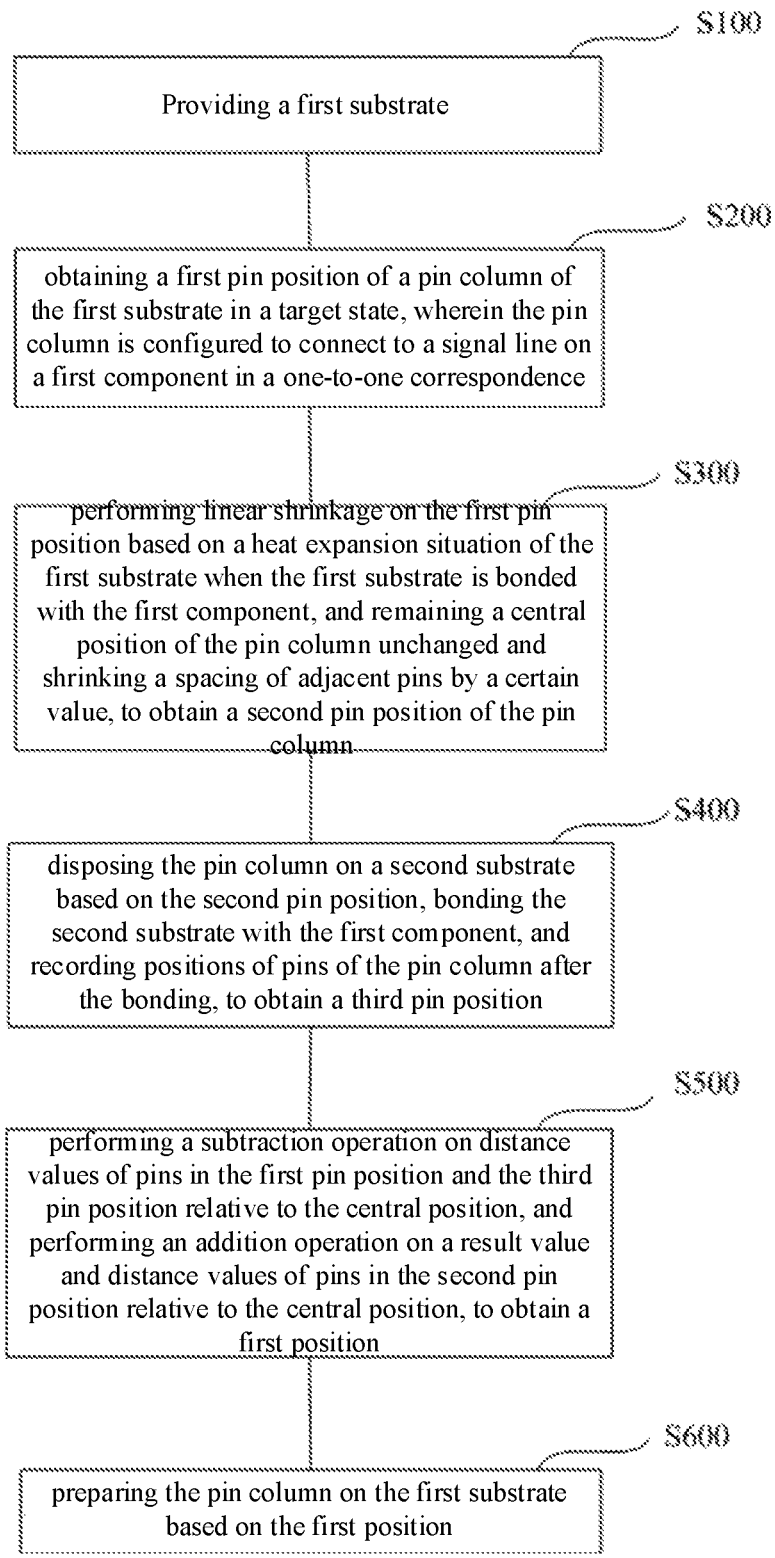
FIG. 1 is a flowchart of a manufacturing method of a circuit board according to an embodiment.

FIG. 1 is a flowchart of a manufacturing method of a circuit board according to an embodiment. The manufacturing method of a circuit board is used to manufacture a flexible circuit board, so that when the flexible circuit board is bonded with a first component, a pin on the flexible circuit board can be accurately aligned with a signal line on the first component. In this embodiment, the first component is a display panel. As shown in FIG. 1, the manufacturing method of a circuit board includes the following steps.

In S100, a first substrate is provided.

In this embodiment, the first substrate is a flexible substrate.

In S200, a first pin position of a pin column of the first substrate in a target state is obtained, where the pin column is used to connect to a signal line on a first component in a one-to-one correspondence.

The first component is a device used to bond with the flexible substrate, so that the signal line on the first component is connected to the pin on the flexible substrate. In this embodiment, the first component is a display panel. The first pin position is a pin position of a pin column of the flexible substrate in a target state, where the pin column is used to connect to the signal line on the display panel in a one-to-one correspondence. The first pin position of the flexible substrate in the target state is a position of a pin disposed on the flexible substrate in a conventional method. Specifically, pins in the first pin position are disposed in positions in a one-to-one correspondence with positions of signal lines on the display panel. A spacing of adjacent pins in the first pin position is equal to a spacing of adjacent signal lines on the display panel. Moreover, the adjacent pins in the first pin position have an equal spacing, and the spacing is a fixed value. The pins in the first pin position are symmetrically disposed about a central position of the pin column. For the first pin position obtained by using the foregoing method, from the central position of the pin column to two sides of the flexible substrate, serial numbers of the pins and distances from the pins to the central position of the pin column are in a linear relationship, as shown in FIG. 2.

Figure 2:
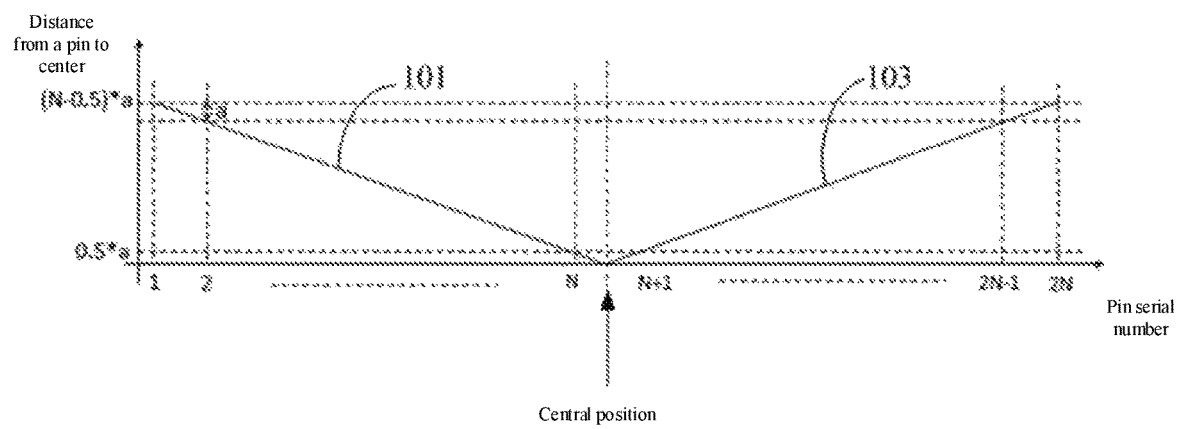
FIG. 2 is a schematic diagram of positions of pins in a first pin position relative to a central position in S200 according to an embodiment.

As shown in FIG. 2, assuming that a total quantity of pins in the first pin position of the flexible substrate is 2N, and the spacing of adjacent pins in the first pin position is a, thus distances from pins at two edges of the pin column to the central position are all $(N-0.5)*a$. A relationship between a serial number of each pin in the first pin position and a distance from each pin to the central position of the pin column is shown by line 101 and line 103 in FIG. 2.

In S300, linear shrinkage is performed on the first pin position based on a heat expansion situation of the first substrate when the first substrate is bonded with the first component, and a central position of the pin column is remained unchanged and a spacing of adjacent pins is shrunk by a certain value, to obtain a second pin position of the pin column.

In this embodiment, step S300 includes: obtaining an expansion quantity of pins at two edges separately relative to the central position of the pin column after the pin column disposed based on the first pin position is bonded, and performing linear proportional shrinkage on the first pin position based on the expansion quantity, where a shrinkage quantity of each pin is a multiplication value of the expansion quantity and a ratio of a distance between the pin and the central position of the pin column to a distance between a pin at an edge and the central position of the pin column. Pin columns of the obtained second pin position are symmetrical about the central position of the pin column.

In this embodiment, the pin column is disposed on the flexible substrate based on the first pin position and hot pressing is performed, so that an expansion quantity of pins at two edges of the hot-pressed pin column relative to the central position of the pin column can be obtained. Linear proportional shrinkage is performed on pins in the first pin position based on the expansion quantity of the pins at the two edges, to offset impact of the heat expansion on the position of the pin column. The shrinkage quantity of each pin in the first pin position is $d=d1*B/D$. $d1$ is a distance of a corresponding pin relative to the central position of the pin column. $D$ is a distance from a pin at an edge to the central position of the pin column. $B$ is an expansion quantity of a pin at an edge relative to the central position of the pin column.

Figure 3:
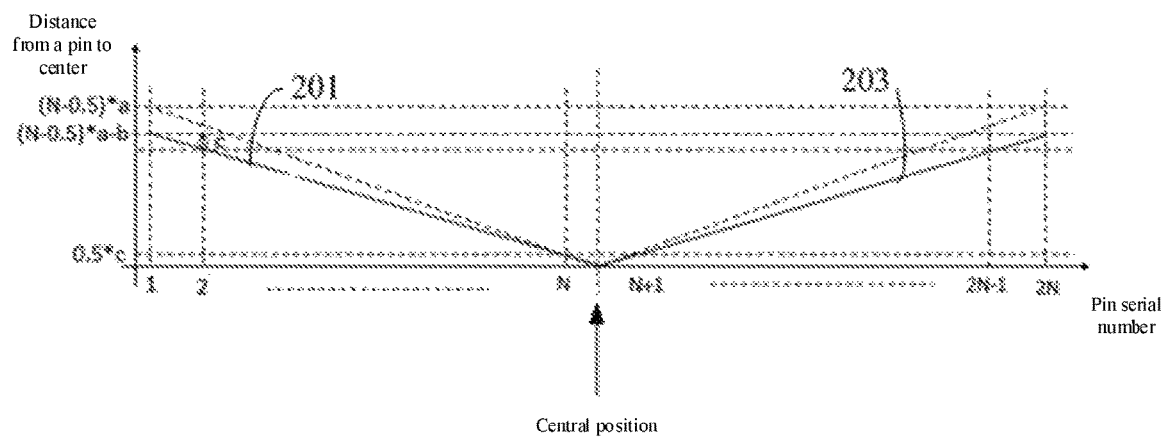
FIG. 3 is a schematic diagram of positions of pins in a second pin position relative to a central position in S300 according to an embodiment.

As shown in FIG. 3, in this embodiment, it is assumed that a total quantity of pins in the second pin position is 2N. Using the central position of the pin column as a reference, the expansion quantity of a pin at an edge of pin column relative to the central position of the pin column after the hot-pressed is b. The pins at the two edges of the pin column have a same expansion quantity in the bonding process, and the expansion quantity is b. When setting the second pin position, after linear proportional preshrinking is performed based on the expansion quantity of the pins at the two edges of the pin column, the spacing of adjacent pins is $c=[(2N-1)*a-2b]/(2N-1)$, and a distance from the pins at the two edges to the central position of the pin column becomes $(N-0.5)*a-b$. a is a spacing of two adjacent pins in the first pin position. A relationship between a serial number of each pin in the second pin position and a distance from each pin to the central position of the pin column is shown by line 201 and line 203 in FIG. 3. Two dotted lines in FIG. 3 represent the line 101 and the line 103 in FIG. 2.

In S400, the pin column is disposed on a second substrate based on the second pin position, the second substrate is bonded with the first component, and positions of pins of the pin column after the bonding is recorded, to obtain a third pin position.

The second substrate is a substrate different from the first substrate. The second substrate is a sample substrate. A second pin is disposed on the sample substrate and a bonding process is performed, to obtain a third pin. In this embodiment, a position of the third pin is a position of a pin disposed on a sample flexible substrate after the pin is disposed on the sample flexible substrate based on the second pin position and hot pressing is performed. Pin columns in the third pin position are symmetrical about the central position of the pin column. After the pin is disposed on the sample flexible substrate based on the position of the second pin in FIG. 3 and hot pressing is performed, a relationship between a number of each pin in the third pin position and a distance from each pin to the central position of the pin column is shown by line 301 and line 303 in FIG. 4.

Figure 4:
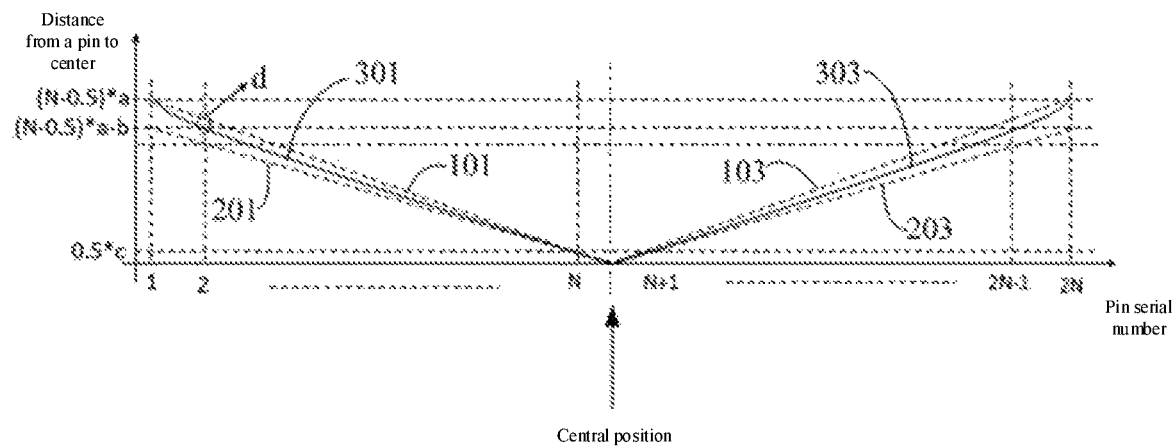
FIG. 4 is a schematic diagram of positions of pins in a third pin position relative to a central position in S400 according to an embodiment.

As shown in FIG. 4, the line 201 and the line 203 represent a relationship between a serial number of each pin in the second pin position and a distance from each pin to the central position of the pin column in FIG. 3. The line 301 and the line 303 represent a relationship between a serial number of each pin in the third pin position and a distance from each pin to the central position of the pin column. The line 101 and the line 103 represent a relationship between a serial number of each pin in the first pin position and a distance from each pin to the central position of the pin column. The position of each pin in the first pin position is in a one-to-one correspondence to the position of the signal line on the display panel. That is, if the position of the hot-pressed pin column of the flexible substrate is the same as the first pin position (that is, the position of the heat-expanded pin column after being bonded is the first pin position), the pin on the flexible substrate can be accurately aligned with the signal line on the display panel. As shown in FIG. 4, when the pin is disposed on the flexible substrate based on the line 201 and the line 203, a relationship between pin positions on the hot-pressed flexible substrate is separately shown by the line 301 and the line 303. By respectively comparing the line 301 and the line 101 and comparing the line 303 and the line 103, it can be learned that when the pin is disposed on the flexible substrate based on the second pin position, there is a distance d between the hot-pressed pin position and the target pin position (the first pin position).

In S500, a subtraction operation is performed on distance values of pins in the first pin position and the third pin position relative to the central position of the pin column, and an addition operation is performed on a result value and distance values of pins in the second pin position relative to the central position of the pin column, to obtain a first position.

The first position is a position of the to-be-disposed pin column. In this embodiment, a distance value between each pin in the first pin position and the central position of the pin column is obtained, and the distance value is represented as d1 (n, y1). A distance value between each pin in the second pin position and the central position of the pin column is obtained, and the distance value is represented as d2 (n, y2). A distance value between each pin in the third pin position and the central position of the pin column is obtained, and the distance value is represented as d3 (n, y3). A distance value between the pin of the to-be-disposed pin column and the central position of the pin column is d5 (n, y5). A distance value between the pin of the to-be-disposed pin column and the central position of the pin column is d5 (n, y5)=[d1(n, y1) d3(n, y3)]+d2 (n, y2). n represents a serial number of the pin, and y1, y2, y3, and y5 are respectively the first pin position, the second pin position, the third pin position, and the distance of the corresponding pin in the to-be-disposed pin column relative to the central position of the pin column. A relationship between the serial number of each pin in the to-be-disposed pin column and the distance from each pin to the central position of the pin column is shown by line 401 and line 403 in FIG. 5.

Figure 5:
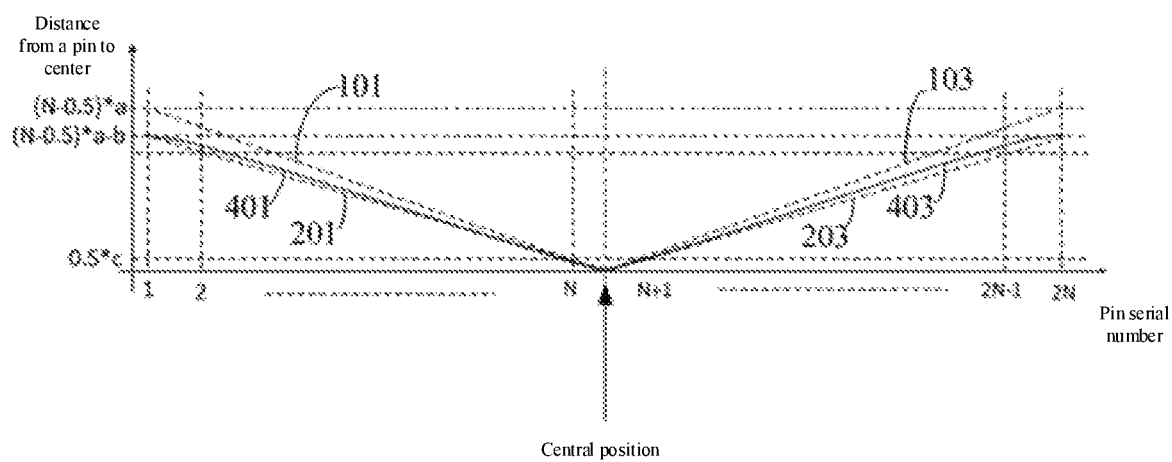
FIG. 5 is a schematic diagram of a position of a to-be-disposed pin column according to an embodiment.
Figure 6:
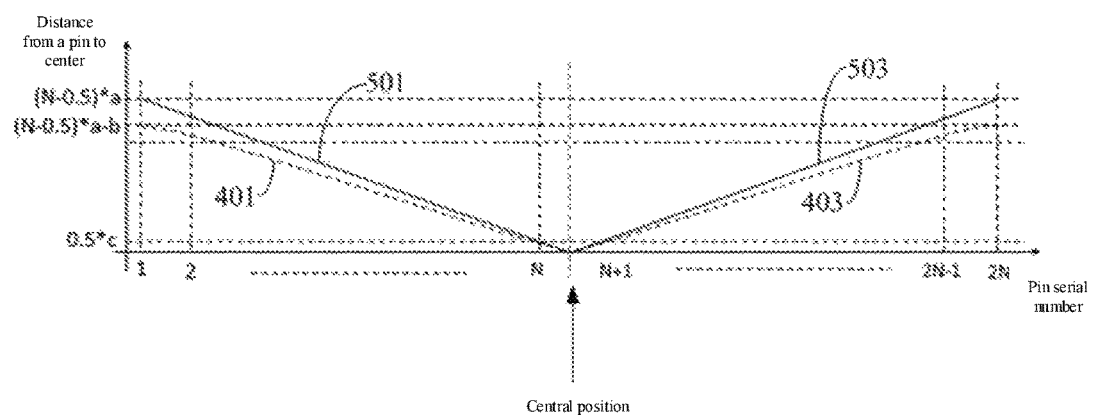
FIG. 6 is a schematic diagram of an embodiment of a position of a pin, after the pin is disposed on a substrate according to the position of the to-be-disposed pin column in FIG. 5, and the hot pressing is performed.

As shown in FIG. 6, after the pin is disposed on the flexible substrate based on the line 401 and the line 403 in FIG. 5, and hot pressing is performed, a relationship between the serial number of each pin on the flexible substrate and the distance from each pin to the central position of the pin column is shown by line 501 and line 503 in FIG. 6. In this case, the line 501 and the line 503 are close to the line 101 and the line 103 respectively. That is, when the pin is disposed on the flexible substrate based on the position of the to-be-disposed pin column, after the hot pressing is performed, the pin position on the flexible substrate is close to the first pin position in an ideal state. Therefore, after the pin is disposed on the flexible substrate based on the line 401 and the line 403, and the hot pressing is performed, the pin on the flexible substrate can be more accurately aligned with the signal line on the display panel. In this way, the problem that the pin is misplaced or short-circuited when the flexible circuit board is bonded with the display panel can be avoided, thereby improving a good rate of the product.

In this embodiment, an obtained position relationship of pin positions of the to-be-disposed pin column relative to the central position of the pin column, and a position relationship of the pins in the third pin position relative to the central position of the pin column are in a relationship of an inverse change rate. That is, change rates of the line 301 and the line 401 are in a relationship of an inverse change rate. Change rates of the line 303 and the line 403 are in a relationship of an inverse change rate.

In S600, the pin column is disposed on the first substrate based on the first position.

In this embodiment, after the position of the to-be-disposed pin column is obtained, the pin column is disposed on the flexible substrate based on the position of the to-be-disposed pin column.

In an embodiment, a circuit board is further provided. The circuit board is a flexible circuit board. The circuit board includes a substrate and a pin column. A pin column is disposed on the substrate; and the substrate is used for the pin column to connect to a signal line on an external component in a one-to-one correspondence after the substrate is bonded with the external component. In this embodiment, the circuit board is a flexible circuit board manufactured by using the manufacturing method according to any one of the foregoing embodiments.

The circuit board can be applied to various electronic devices, such as a display device. When the circuit board is applied to a display device, the display device can be an LCD display device, an OLED display device, a QLED display device, a curved display device, or other display devices, but is not limited thereto.

In an embodiment, a display device is further provided. The display device includes a circuit board and a display panel. The circuit board is the circuit board described in the foregoing embodiments. The display panel includes signal lines. The signal lines of the display panel are used to bond with and connect to pins of the circuit board. In this embodiment, two adjacent lines in the signal lines of the display panel have an equal spacing.

The display panel can be, for example, an LCD display panel, an OLED display panel, a QLED display panel, a curved display panel, or other display panel.

The foregoing embodiments only describe several implementations of this application, which are described specifically and in detail, however which should not be construed as a limitation to the patent scope of the present invention. It should be noted that, a person of ordinary skill in the art may make various changes and improvements without departing from the ideas of this application, which shall all fall within the protection scope of this application. Therefore, the protection scope of the patent of this application shall be subject to the appended claims.

The invention claimed is:
1. A manufacturing method of a circuit board, comprising:
providing a first substrate;
obtaining a first pin position of a pin column of the first substrate in a target state, wherein the pin column is configured to connect to a signal line on a first component in a one-to-one correspondence;
performing linear shrinkage on the first pin position based on a heat expansion situation of the first substrate when the first substrate is bonded with the first component, and remaining a central position of the pin column unchanged and shrinking a spacing of adjacent pins by a certain value, to obtain a second pin position of the pin column;
disposing the pin column on a second substrate based on the second pin position, bonding the second substrate with the first component, and recording positions of pins of the pin column after the bonding, to obtain a third pin position;
performing a subtraction operation on distance values of pins in the first pin position and the third pin position relative to the central position, and performing an addition operation on a result value and distance values of pins in the second pin position relative to the central position, to obtain a first position; and
disposing the pin column on the first substrate based on the first position.
2. The manufacturing method according to claim 1, wherein the first substrate is a flexible substrate.
3. The manufacturing method according to claim 1, wherein the first component is a display panel.
4. The manufacturing method according to claim 1, wherein the spacing of the adjacent pins in the first pin position is equal to a spacing of corresponding adjacent signal lines in the first component.
5. The manufacturing method according to claim 1, wherein the adjacent pins in the first pin position have an equal spacing.
6. The manufacturing method according to claim 1, wherein
pins in the first pin position are symmetrically disposed about the central position;
pins in the second pin position are symmetrically disposed about the central position; and
pins in the third pin position are symmetrically disposed about the central position.
7. The manufacturing method according to claim 1, comprising:
obtaining an expansion quantity of pins at two edges separately relative to the central position after the pin column disposed based on the first pin position is bonded, and performing linear proportional shrinkage on the first pin position based on the expansion quantity, wherein a shrinkage quantity of each pin is a multiplication value of the expansion quantity and a ratio of a distance between the pin and the central position to a distance between a pin at an edge and the central position.
8. The manufacturing method according to claim 7, wherein using the central position of the pin column as a reference, the pins at the two edges of the pin column have a same expansion quantity in a bonding process.
9. The manufacturing method according to claim 7, wherein a distance from a pin at an edge of the second pin position to the central position is $(N-0.5)*a-b$, and a spacing of two adjacent pins is $c=[(2N-1)*a-2b]/(2N-1)$, wherein
N represents a total quantity of pins in an area from the central position to an edge; a represents a spacing of adjacent pins in the first pin position; and b represents an expansion quantity of a pin at an edge relative to the central position after being bonded.
10. The manufacturing method according to claim 1, wherein an obtained position relationship of pin positions of a to-be-disposed pin column relative to the central position of the pin column, and a position relationship of pins in the third pin position relative to the central position of the pin column are in a relationship of an inverse change rate.
11. A manufacturing method of a circuit board, comprising:
providing a first substrate;
obtaining a first pin position of a pin column of the first substrate in a target state, wherein the pin column is configured to connect to a signal line on a first component in a one-to-one correspondence;
obtaining an expansion quantity of pins at two edges separately relative to the central position after the pin column disposed based on the first pin position is bonded, and performing linear proportional shrinkage on the first pin position based on the expansion quantity, wherein a shrinkage quantity of each pin is a multiplication value of the expansion quantity and a ratio of a distance between the pin and the central position to a distance between a pin at an edge and the central position, to obtain a second pin position of the pin column;
disposing the pin column on a second substrate based on the second pin position, bonding the second substrate with the first component, and recording positions of pins of the pin column after the bonding, to obtain a third pin position, wherein pins in the first pin position are symmetrically disposed about the central position, pins in the second pin position are symmetrically disposed about the central position, and pins in the third pin position are symmetrically disposed about the central position;

performing a subtraction operation on distance values of pins in the first pin position and the third pin position relative to the central position, and performing an addition operation on a result value and distance values of pins in the second pin position relative to the central position, to obtain a first position; and disposing the pin column on the first substrate based on the first position.

* * * * *